US012713585B2

(12) United States Patent
Hsu et al.

(10) Patent No.: US 12,713,585 B2
(45) Date of Patent: Aug. 18, 2026

(54) MEMORY DEVICE AND FORMING METHOD THEREOF

(71) Applicant: NANYA TECHNOLOGY CORPORATION, New Taipei City (TW)

(72) Inventors: Kuo Chung Hsu, Kaohsiung City (TW); En-Jui Li, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 477 days.

(21) Appl. No.: 18/204,795

(22) Filed: Jun. 1, 2023

(65) Prior Publication Data

US 2024/0407153 A1 Dec. 5, 2024

(51) Int. Cl.
*H10B 12/00* (2023.01)

(52) U.S. Cl.
CPC ........... *H10B 12/482* (2023.02); *H10B 12/02* (2023.02)

(58) Field of Classification Search
CPC ...................... H10D 64/021; H01L 2221/1042
See application file for complete search history.

(56) References Cited

U.S. PATENT DOCUMENTS

| | | | | |
|---|---|---|---|---|
| 9,425,200 B2* | 8/2016 | Hwang | .................. | H10B 12/30 |
| 2019/0348418 A1 | 11/2019 | Hwang et al. | | |
| 2020/0020697 A1* | 1/2020 | Kim | ..................... | H10B 12/482 |
| 2020/0105577 A1* | 4/2020 | Liang | ..................... | H10D 30/62 |
| 2022/0208766 A1* | 6/2022 | Kim | ....................... | H10B 12/30 |

OTHER PUBLICATIONS

Q Han et al., "A DTCO approach on DRAM bit line capacitance and sensing margin improvement", 2020 IEEE 15th International Conference on Solid-State & Integrated Circuit Technology (ICSICT), Nov. 3-6, 2020, DOI: 10.1109/ICSICT49897.2020.9278287 (file attached, ref. 01).

J.M. Park et al., "20nm DRAM: A new beginning of another revolution", 2015 IEEE International Electron Devices Meeting (IEDM), Dec. 7-9, 2015, DOI: 10.1109/IEDM.2015.7409774 (file attached, ref. 02).

T. Schloesser et al., "A 6F2 Buried Wordline DRAM Cell for 40nm and Beyond", 2008 IEEE International Electron Devices Meeting, Dec. 15-17, 2008, DOI: 10.1109/IEDM.2008.4796820 (file attached, ref. 03).

* cited by examiner

*Primary Examiner* — Edward Chin
(74) *Attorney, Agent, or Firm* — CKC & Partners Co., LLC

(57) ABSTRACT

The present disclosure provides a memory device and the forming method thereof. The memory device includes a bit line on a substrate, a multilayer spacer covering the bit line, a low-k dielectric layer and an air gap interposed in the multilayer spacer, and a cell contact adjacent to the multilayer spacer. The multilayer spacer, the low-k dielectric layer, and the air gap are disposed between the bit line and the cell contact. The top surface of the low-k dielectric layer is lower than a top surface of the bit line. The air gap is above the low-k dielectric layer, and an orthogonal projection of the air gap onto the substrate is partially overlapped with that of the low-k dielectric layer onto the substrate.

12 Claims, 16 Drawing Sheets

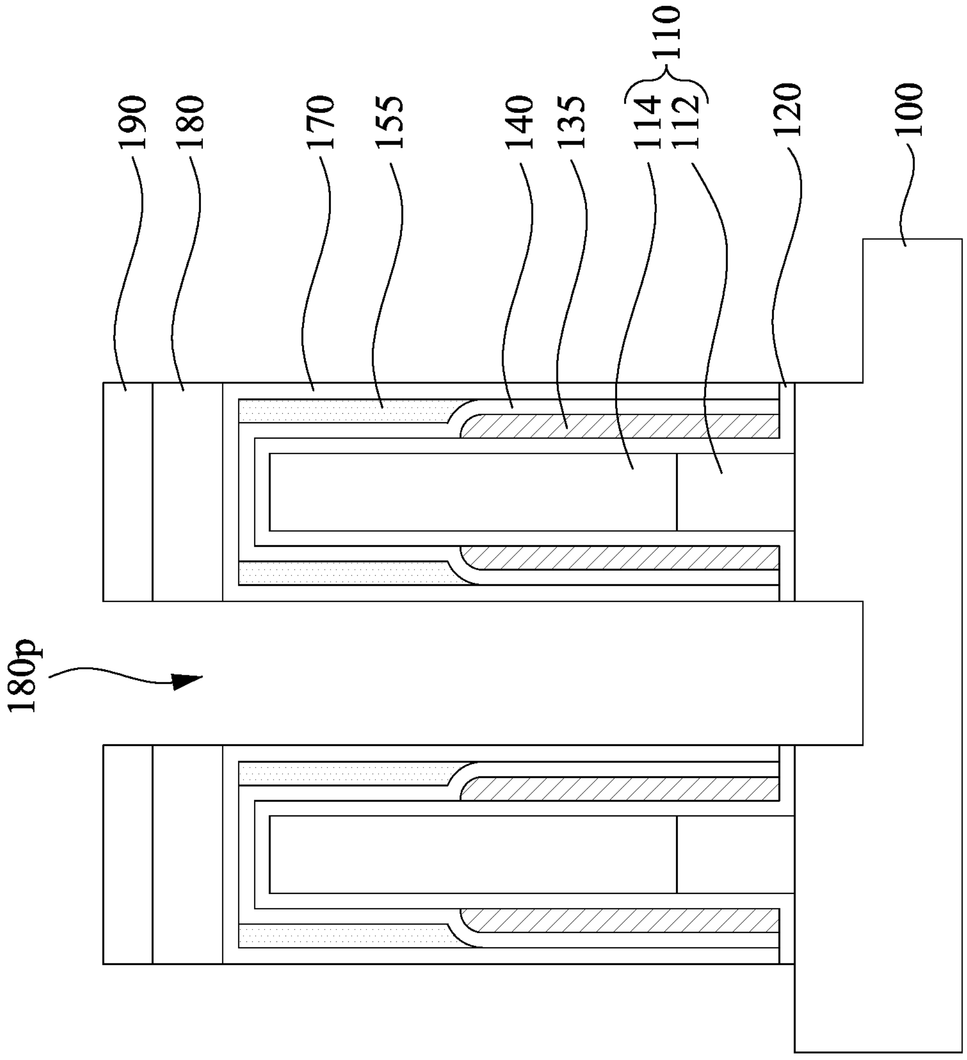
Fig. 2L
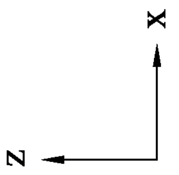

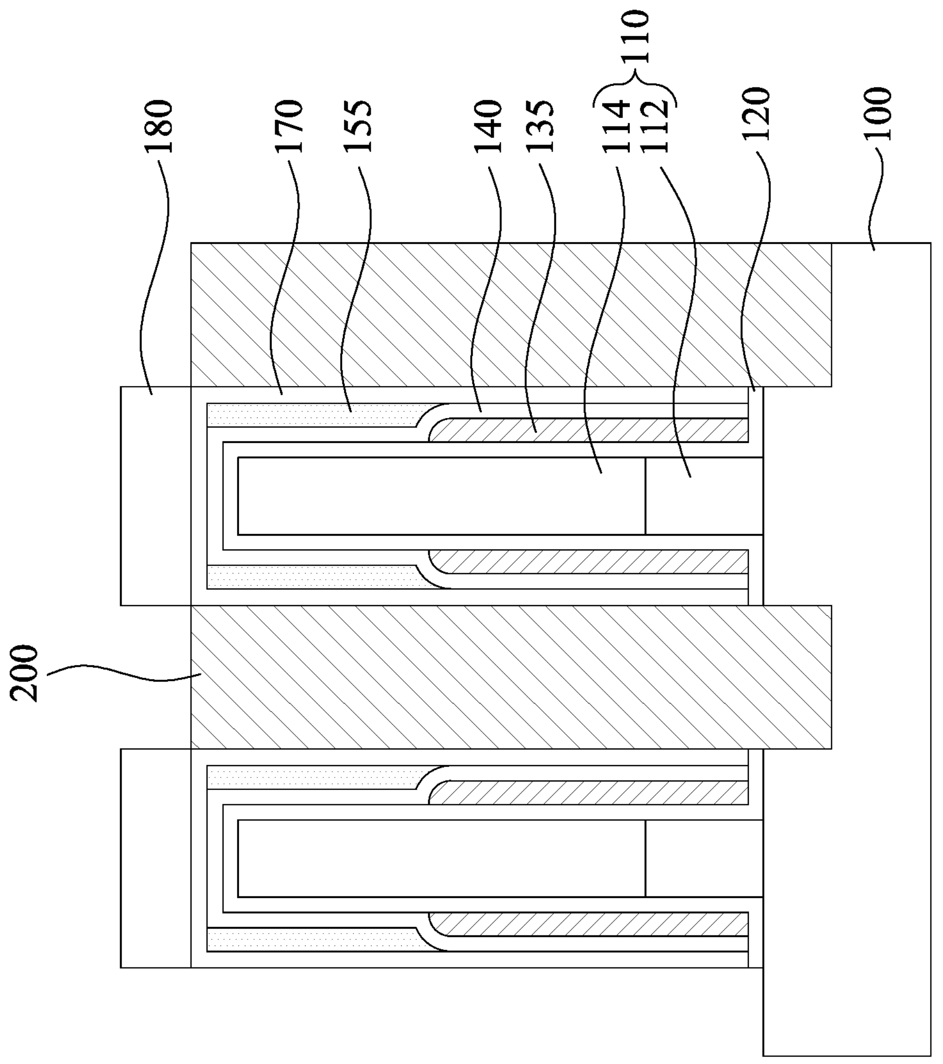
Fig. 2M
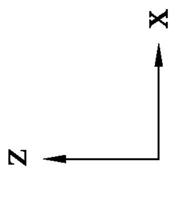

MEMORY DEVICE AND FORMING METHOD THEREOF

BACKGROUND

Field of Invention

The present disclosure relates to a memory device and the forming method thereof. More particularly, the present disclosure relates to the memory device having the air gap.

Description of Related Art

As the critical dimension (CD) of the features in the memory device becomes smaller, the size of the memory device is correspondingly reduced, thereby increasing the element density in the device. However, the reduced distance between the compact elements may easily induce the parasitic capacitance impacting the elements. Therefore, an approach to form the air gap that effectively decreases the parasitic capacitance without damaging the elements is required for the formation of the memory device.

SUMMARY

According to some embodiments of the present disclosure, the memory device includes a bit line on a substrate, a multilayer spacer covering the bit line, and a low-k dielectric layer interposed in the multilayer spacer, in which a top surface of the low-k dielectric layer is lower than a top surface of the bit line. The memory device also includes an air gap interposed in the multilayer spacer, in which the air gap is above the low-k dielectric layer. An orthogonal projection of the air gap onto the substrate is partially overlapped with that of the low-k dielectric layer onto the substrate. The memory device also includes a cell contact adjacent to the multilayer spacer, wherein the multilayer spacer, the low-k dielectric layer, and the air gap are disposed between the bit line and the cell contact.

In some embodiments, the top surface of the low-k dielectric layer is between the top surface of the bit line and a top surface of a work function layer in the bit line.

In some embodiments, a ratio of a height of the low-k dielectric layer to a height of the bit line is equal to or higher than 0.5.

In some embodiments, a dielectric constant of the low-k dielectric layer is in a range of 2.7 to 3.1.

In some embodiments, the multilayer spacer includes a first spacer layer covering a sidewall and the top surface of the bit line, a second spacer layer covering the low-k dielectric layer and the first spacer layer, and a third spacer layer covering the air gap and the second spacer layer.

In some embodiments, the low-k dielectric layer and the air gap are separated by the second spacer layer.

In some embodiments, a sidewall of the first spacer layer is parallel to a sidewall of the third spacer layer. The low-k dielectric layer, the second spacer layer, and the air gap are sandwiched between the first spacer layer and the third spacer layer.

In some embodiments, a thickness of the second spacer layer is smaller than a width of the low-k dielectric layer.

In some embodiments, a width of the air gap is equal to a width of the low-k dielectric layer.

In some embodiments, a top surface of the air gap is higher than the top surface of the bit line.

In some embodiments, the first spacer layer, the second spacer layer, and the third spacer layer includes a same material.

In some embodiments, the second spacer layer directly contacts a top surface of the first spacer layer, and the third spacer layer directly contacts a top surface of the second spacer layer.

In some embodiments, the memory device further includes a landing pad above the bit line and the multilayer spacer, in which the landing pad is electrically connected to the bit line through the multilayer spacer.

According to some embodiments of the present disclosure, the method of forming a memory device includes the following steps. A first spacer layer is formed to cover a bit line on a substrate. A low-k dielectric layer is formed on a sidewall of the first spacer layer, where a top surface of the low-k dielectric layer is lower than a top surface of the bit line. A second spacer layer is formed to cover the low-k dielectric layer and the first spacer layer. A sacrificial layer is formed on a sidewall of the second spacer layer, where the sacrificial layer is above the low-k dielectric layer, and an orthogonal projection of the sacrificial layer onto the substrate is partially overlapped with that of the low-k dielectric layer onto the substrate. A third spacer layer is formed to cover the sacrificial layer and the second spacer layer. A cell contact is formed adjacent to the third spacer layer. The sacrificial layer is removed to form an air gap between the second spacer layer and the third spacer layer.

In some embodiments, a material of the low-k dielectric layer is different from a material of the sacrificial layer.

In some embodiments, forming the low-k dielectric layer includes forming a low-k dielectric material covering the first spacer layer and etching the low-k dielectric material to form the low-k dielectric layer. The top surface of the low-k dielectric layer after etching is higher than a top surface of a work function layer in the bit line.

In some embodiments, forming the second spacer layer includes conformally forming the second spacer layer on the low-k dielectric layer and the first spacer layer. An outer surface portion of the second spacer layer covering the low-k dielectric layer is noncoplanar with an outer surface portion of the second spacer layer covering the first spacer layer.

In some embodiments, forming the sacrificial layer includes forming a sacrificial material covering the sidewall of the second spacer layer, forming a mask layer on a top surface of the second spacer layer, and etching the sacrificial material by using the mask layer to form the sacrificial layer. A width of the mask layer is larger than a width of the top surface of the second spacer layer. An outer surface of the second spacer layer is exposed after etching the sacrificial material.

In some embodiments, an outer surface of the sacrificial layer is coplanar with an outer surface of the second spacer layer after forming the sacrificial layer.

In some embodiments, a top surface of the sacrificial layer is coplanar with a top surface of the second spacer layer after forming the sacrificial layer.

According to the above-mentioned embodiments, the memory device provided by the present disclosure includes a multilayer spacer between the bit line and the cell contact, in which a low-k dielectric layer and an air gap are interposed in the multilayer spacer. The low-k dielectric layer protects the bit line structure during the formation of the air gap to increase the device reliability. The low-k dielectric layer and the air gap reduce the parasitic capacitance between the bit line and the cell contact to improve the device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
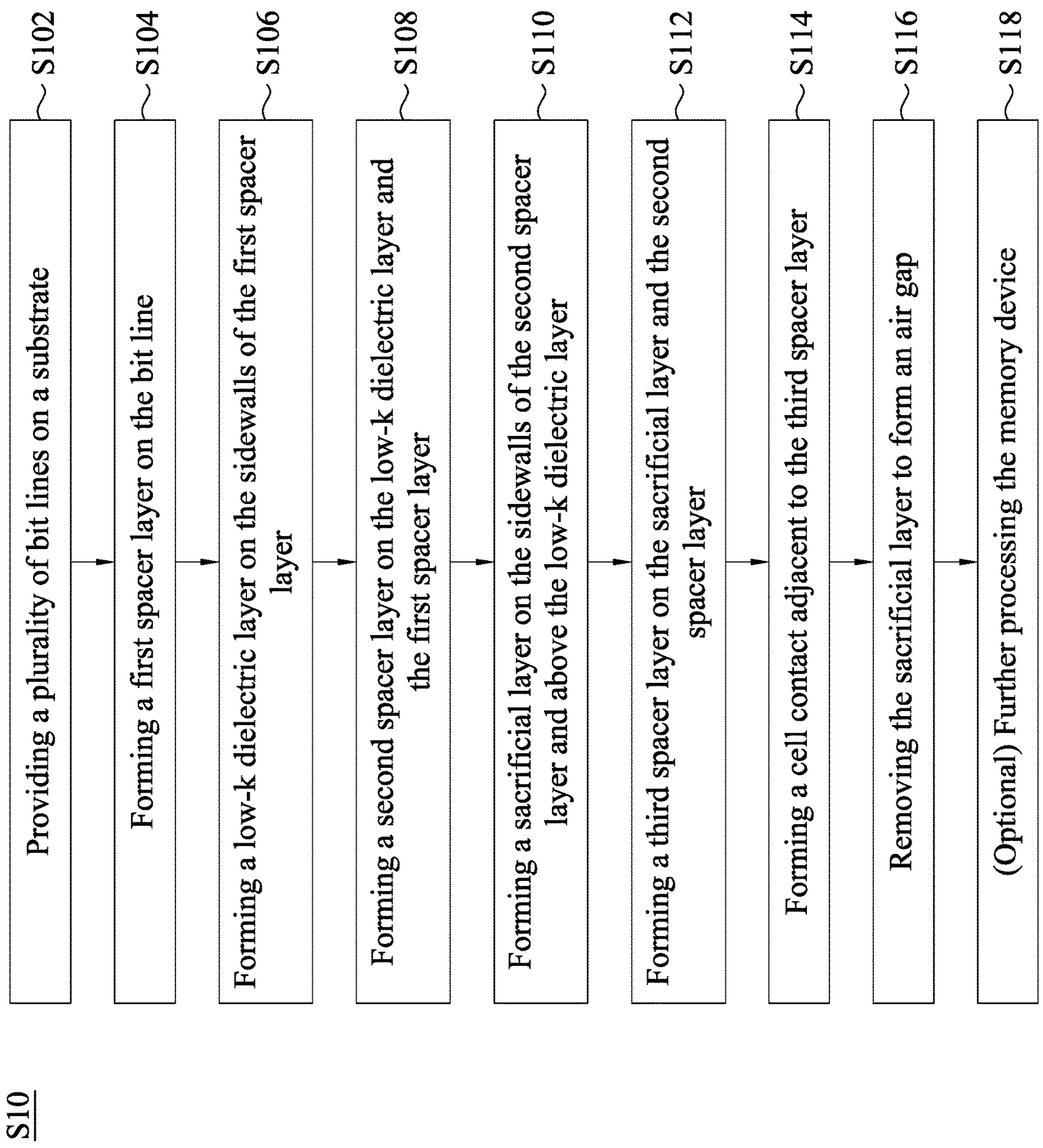
FIG. 1 illustrates a method flow diagram of forming a memory device according to some embodiments of the present disclosure.

The following disclosure provides many different embodiments, or examples, for implementing different features of the provided subject matter. Specific examples of components, arrangements, etc., are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides a memory device including a bit line on a substrate, a multilayer spacer covering the bit line, a low-k dielectric layer and an air gap interposed in the multilayer spacer, and a cell contact adjacent to the multilayer spacer. The air gap is above the low-k dielectric layer, and an orthogonal projection of the air gap onto the substrate is partially overlapped with that of the low-k dielectric layer onto the substrate. The low-k dielectric layer protects the bit line structure during the formation of the air gap, thereby increasing the reliability of the memory device. In addition, the low-k dielectric layer and the air gap reduce the parasitic capacitance between the bit line and the cell contact, which improves the performance of the memory device.

Figure 2A:
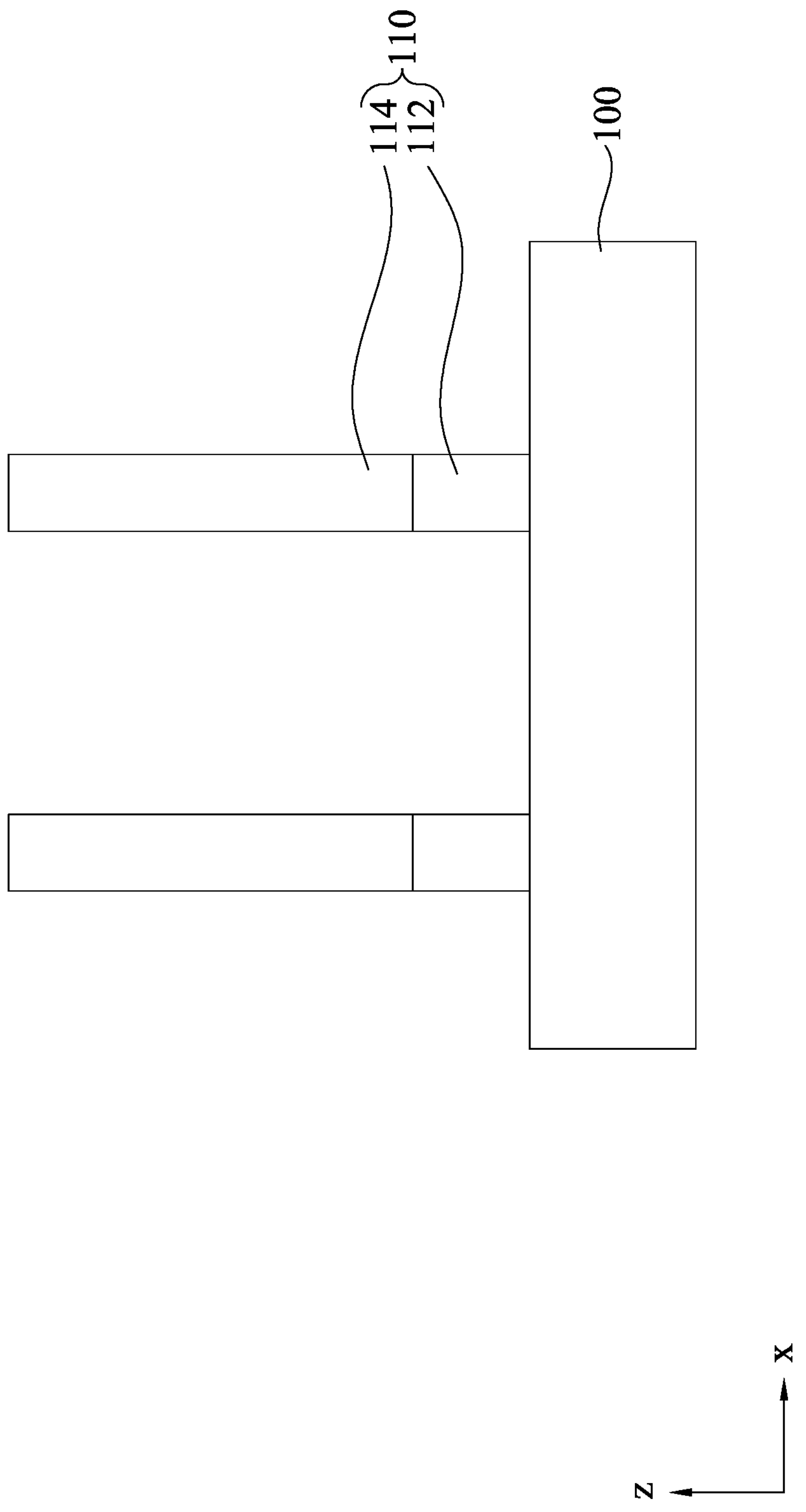
FIGS. 2A to 2O illustrate cross-sectional views of a memory device at various intermediate stages of a forming process according to some embodiments of the present disclosure.

According to some embodiments of the present disclosure, FIG. 1 illustrates a flow diagram of method S10 of forming a memory device. FIGS. 2A to 2O illustrate cross-sectional views of a memory device at various intermediate stages of the forming method S10 in FIG. 1. The manufacturing of the memory device 10 shown in FIG. 2O is taken as an example to depict the forming method S10. However, those skilled in the art should understand that the method shown in FIG. 1 and FIGS. 2A to 2O can not only be used to form the memory device 10, but also can be used to form other memory devices having the air gap within the scope of the present disclosure.

Referring to FIG. 1 and FIG. 2A, the method S10 starts from step S102, where a plurality of bit lines 110 are provided on a substrate 100. The bit line 110 includes a work function layer 112 and a capping layer 114 on the work function layer 112. The work function layer 112 may include suitable conductive material to provide the read/write function of the bit line 110. The capping layer 114 isolates the work function layer 112 from the following elements formed on the bit line 110 to protect the work function layer 112.

In some embodiments, the work function layer 112 may include a single layer or multilayers of metal, metal nitride, metal silicide, metal compound, alloy, polysilicon, dielectric material, or combinations thereof. In some embodiments, the capping layer 114 may include dielectric material, such as silicon oxide, silicon nitride, combinations thereof, or the like.

Figure 2B:
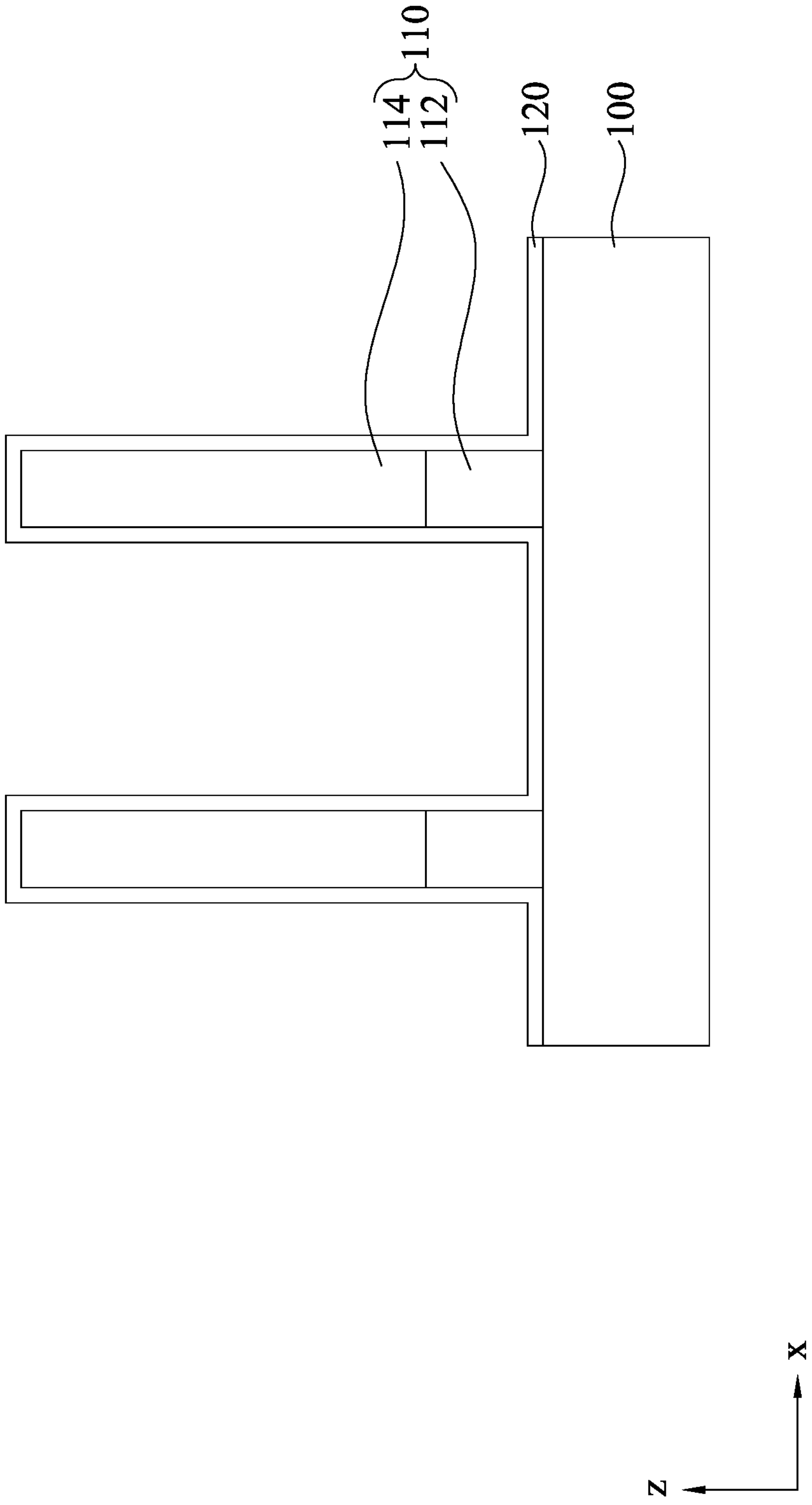

Referring to FIG. 1 and FIG. 2B, the method S10 proceeds to step S104, where a first spacer layer 120 is formed on the bit line 110. Specifically, the first spacer layer 120 is conformally formed on the bit line 110 to cover the top surface and the sidewalls of the bit line 110. The first spacer layer 120 protects the bit line 110 in the following process. The first spacer layer 120 may also be formed on the top surface of the substrate 100 so that the first spacer layer 120 continuously covers the substrate 100 and the plurality of bit lines 110.

In some embodiments, the first spacer layer 120 may include suitable dielectric material to protect the bit line 110. For example, the first spacer layer 120 may be formed of silicon nitride. In some embodiments, the first spacer layer 120 may be formed by deposition process, such as chemical vapor deposition (CVD), plasma enhanced chemical vapor deposition (PECVD), atomic layer deposition (ALD), or the like.

Figure 2C:
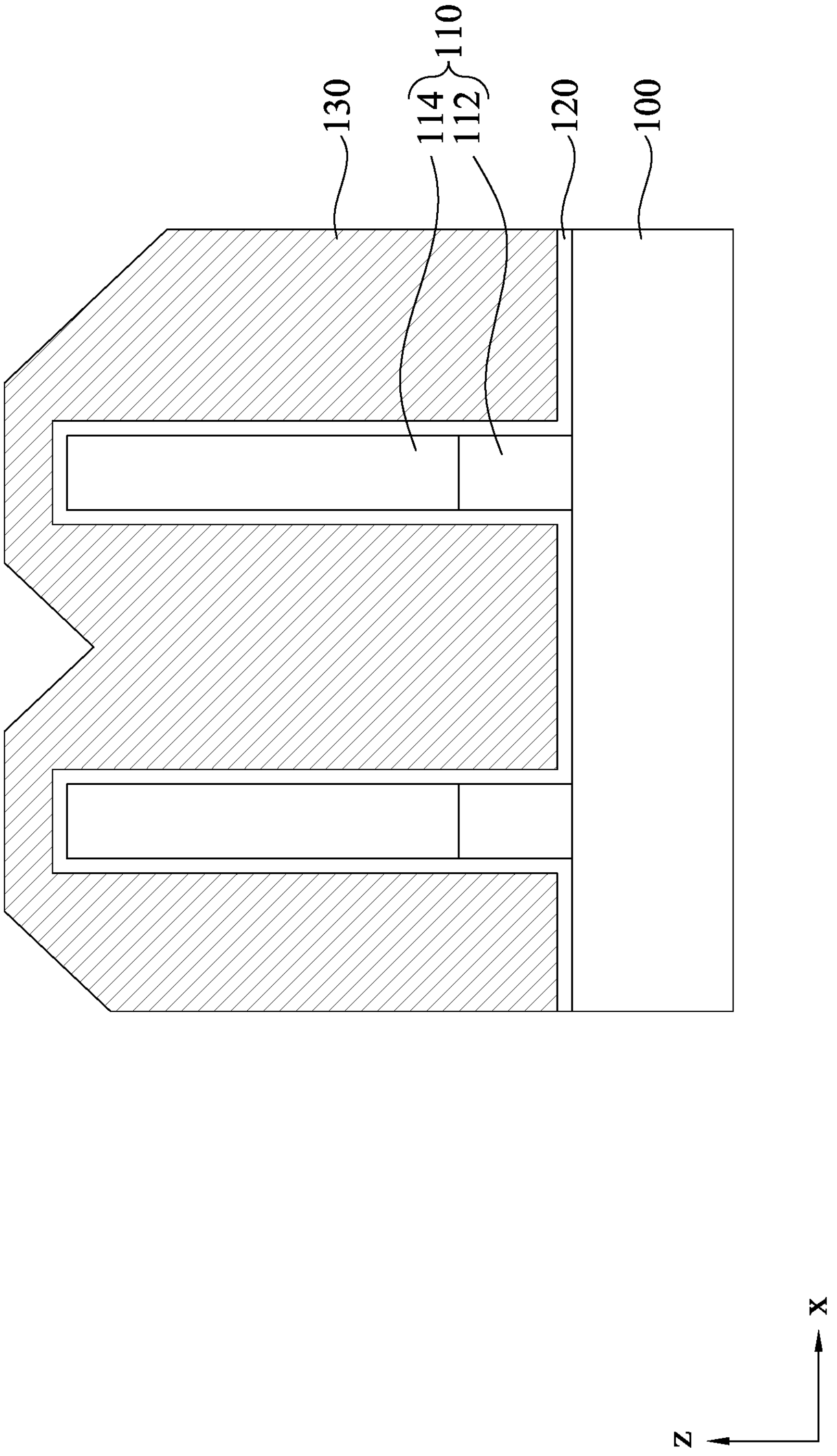
Figure 2D:
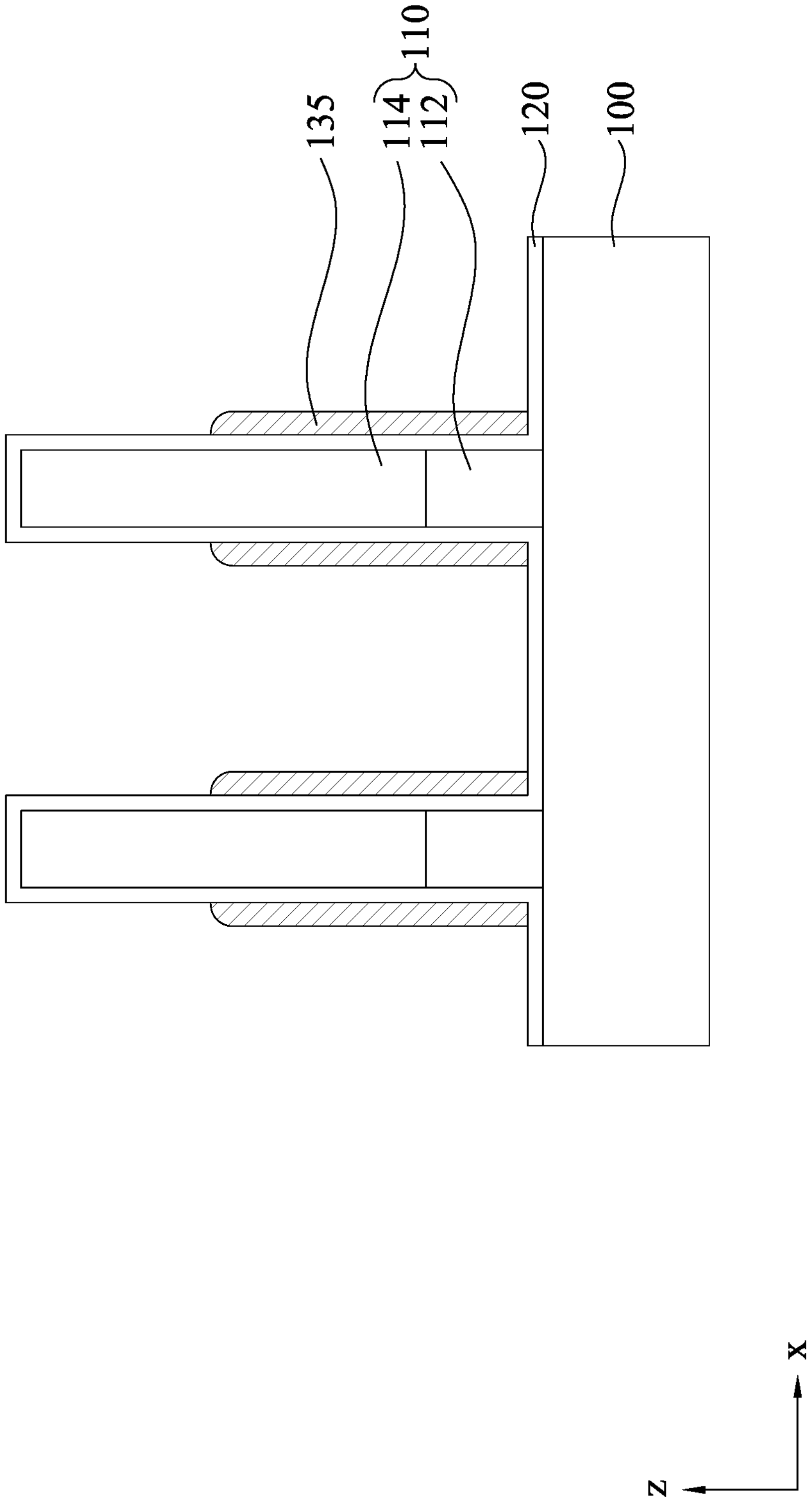

Referring to FIG. 1 and FIGS. 2C to 2D, the method S10 proceeds to step S106, where a low-k dielectric layer 135 is formed on the sidewalls of the first spacer layer 120. Specifically, a low-k dielectric material 130 is first formed over the first spacer layer 120, as shown in FIG. 2C. The low-k dielectric material 130 is filled between the adjacent bit lines 110 until the low-k dielectric material 130 covers the top surface and the sidewalls of the first spacer layer 120. The low-k dielectric material 130 has a dielectric constant lower than 3.9 so that the following formed low-k dielectric layer 135 may reduce the parasitic capacitance near the bit line 110. For example, the dielectric constant of the low-k dielectric material may be in a range of 2.7 to 3.1.

In some embodiments, the low-k dielectric material 130 may include the dielectric material different from that of the first spacer layer 120. For example, when the first spacer layer 120 is formed of nitrides, the low-k dielectric material 130 may include oxides or carbon-doped oxides, such as SiOCH. In some embodiments, the low-k dielectric material 130 may be formed by deposition process, such as chemical vapor deposition, plasma enhanced chemical vapor deposition, atomic layer deposition, or the like. The low-k dielectric material 130 may be formed with a recessed top surface as shown in FIG. 2C or a flat surface parallel to the top surface of the substrate 100, which is not intended to be limiting.

Then, as shown in FIG. 2D, the low-k dielectric material 130 is etched to form the low-k dielectric layer 135. The low-k dielectric layer 135 extends along the sidewall of the first spacer layer 120 in the z-direction. The etching process is operated until the top surface of the low-k dielectric layer 135 is lower than the top surface of the bit line 110 but higher than the top surface of the work function layer 112 in the bit line 110. Since the top surface of the low-k dielectric layer 135 is between the top surface of the bit line 110 and the top surface of the work function layer 112, the low-k dielectric layer 135 may protect the work function layer 112 in the following process. Therefore, the reliability of the resulted memory device 10 is improved even after the air gap, such as air gap 210 shown in FIG. 2N, is formed in the device.

In some embodiments, the height of the low-k dielectric layer 135 in the z-direction is sufficient to have the top surface higher than the top surface of the work function layer 112. For example, a ratio of the height of the low-k dielectric layer 135 to a height of the bit line 110 may be equal to or higher than 0.5. In some embodiments, the etching process to form the low-k dielectric layer 135 may be anisotropic, such as a dry etching process using plasma. The low-k dielectric layer 135 after the etching process may have the round top corners shown in FIG. 2D. In other embodiments, the low-k dielectric layer 135 may have a flat top surface parallel to the top surface of the substrate 100.

Figure 2E:
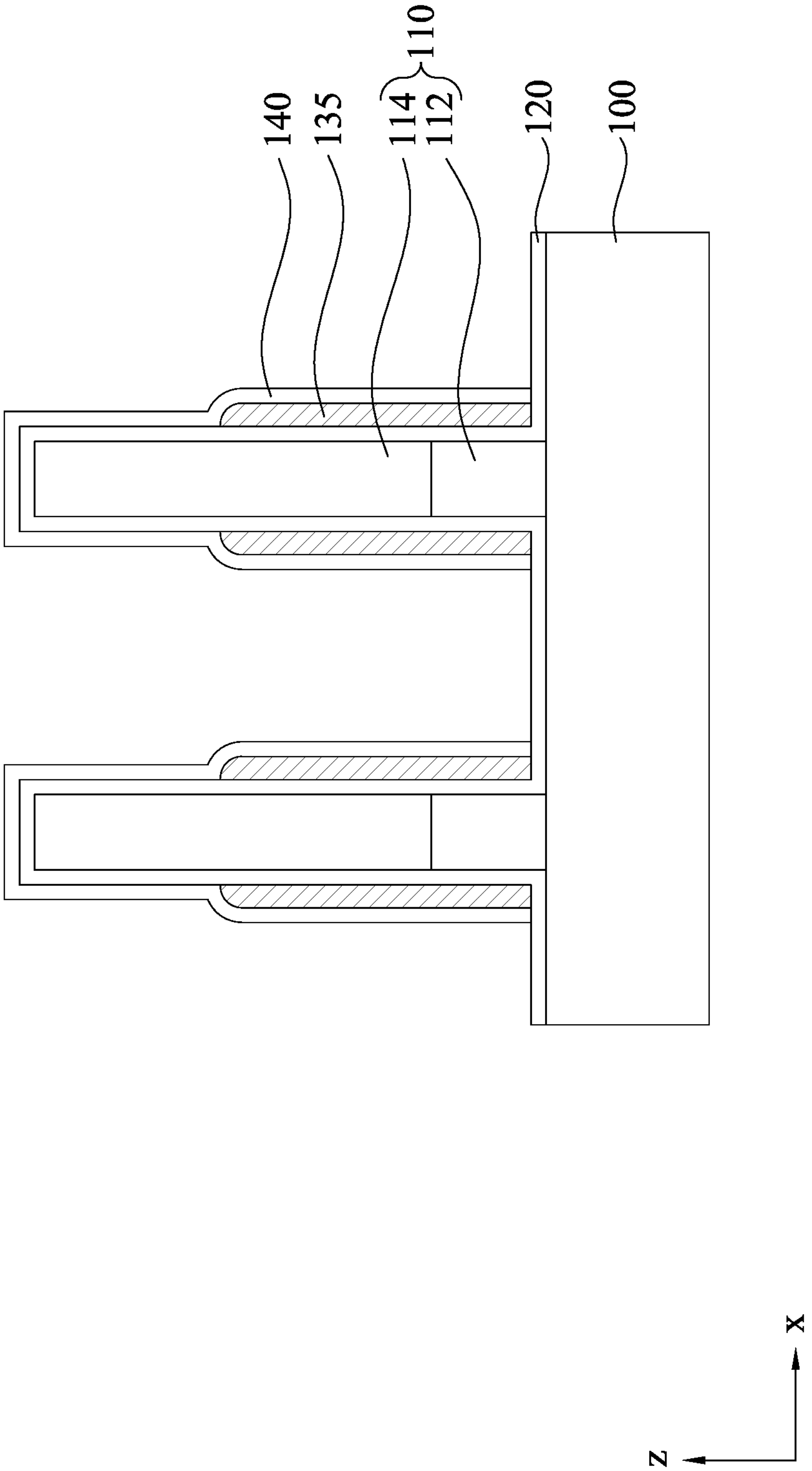

Referring to FIG. 1 and FIG. 2E, the method S10 proceeds to step S108, a second spacer layer 140 is formed on the low-k dielectric layer 135 and the first spacer layer 120. Specifically, the second spacer layer 140 is conformally formed so that the second spacer layer 140 continuously covers the low-k dielectric layer 135 and the first spacer layer 120. The second spacer layer 140 may directly contact the top surface and the sidewalls of the first spacer layer 120 so that the low-k dielectric layer 135 is interposed between the second spacer layer 140 and the first spacer layer 120.

The thickness of the second spacer layer 140 is smaller than a width of the low-k dielectric layer 135 in the x-direction, so an outer surface portion of the second spacer layer 140 covering the low-k dielectric layer 135 is noncoplanar with an outer surface portion of the second spacer layer 140 covering the first spacer layer 120. This reserves the space for forming the air gap above the low-k dielectric layer 135 in the following process. If the thickness of the second spacer layer 140 is larger than the width of the low-k dielectric layer 135, the space right above the low-k dielectric layer 135 may be fully occupied by the second spacer layer 140, which may not reserve enough space for the following formed air gap. In addition, the thickness of the second spacer layer 140 may be uniform over the low-k dielectric layer 135 to cover and protect the low-k dielectric layer 135 in the following process.

In some embodiments, the second spacer layer 140 may extend from above the bit line 110 to the substrate 100 until reaching the first spacer layer 120 on the substrate 100, as shown in FIG. 2E. In some other embodiments, the second spacer layer 140 may further extend in the x-direction along the top surface of the substrate 100. In the embodiments which the low-k dielectric layer 135 has the round top corners, the conformally formed second spacer layer 140 may also show the round corners corresponding to the low-k dielectric layer 135.

In some embodiments, the second spacer layer 140 may include the dielectric material similar to that of the first spacer layer 120, which provides high adhesion between the second spacer layer 140 and the first spacer layer 120. For example, when the first spacer layer 120 is formed of nitrides, the second spacer layer 140 may be formed of the same nitrides. In some embodiments, the second spacer layer 140 may be formed by the deposition process similar to that of the first spacer layer 120, such as atomic layer deposition or the like.

Figure 2F:
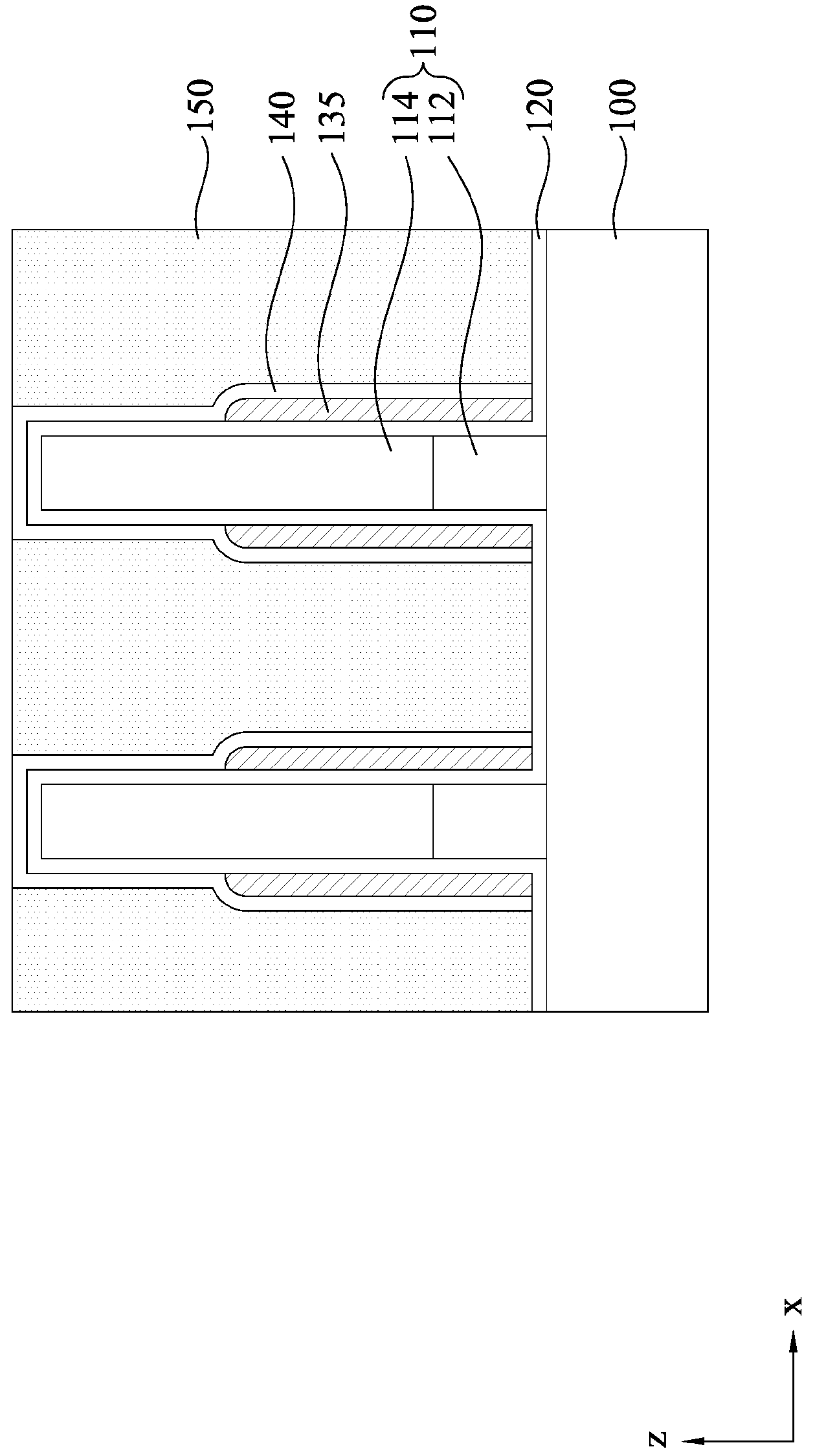

Referring to FIG. 1 and FIGS. 2F to 2H, the method S10 proceeds to step S110, where a sacrificial layer 155 is formed on the sidewalls of the second spacer layer 140 and above the low-k dielectric layer 135. Specifically, a sacrificial material 150 is filled between the adjacent bit lines 110 to cover the sidewalls of the second spacer layer 140, as shown in FIG. 2F. The sacrificial material 150 may be first formed over the top surface of the second spacer layer 140 and subsequently be planarized by, for example, chemical mechanical planarization (CMP), so that the top surface of the sacrificial material 150 is coplanar with the top surface of the second spacer layer 140.

In some embodiments, the sacrificial material 150 may include the dielectric material different from that of the second spacer layer 140. For example, when the second spacer layer 140 is formed of nitrides, the sacrificial material 150 may include oxides. It should be noted that the material of the sacrificial material 150 may also be different from that of the low-k dielectric layer 135 to provide higher etching selectivity in the following process. In some cases where the low-k dielectric layer 135 is formed of SiOCH, the sacrificial material 150 may be formed of SiOx. In some embodiments, the sacrificial material 150 may be formed by deposition process, such as chemical vapor deposition, plasma enhanced chemical vapor deposition, atomic layer deposition, or the like.

Figure 2G:
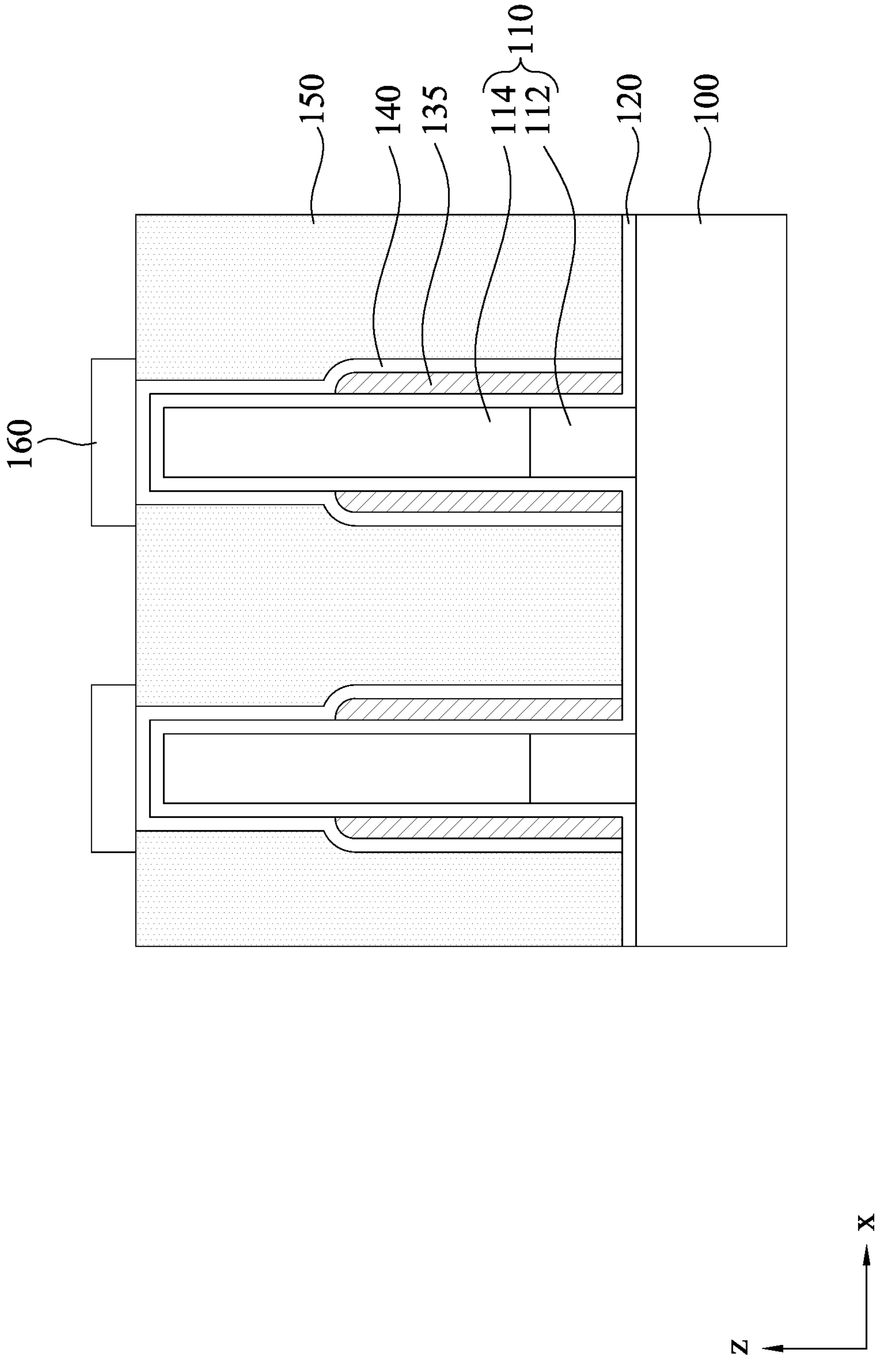

Then, as shown in FIG. 2G, a mask layer 160 is formed on the top surfaces of the sacrificial material 150 and the second spacer layer 140. The mask layer 160 may include photoresist material, so that the mask layer 160 is exposed and developed to cover the top surface of the second spacer layer 140 and expose portions of the sacrificial material 150. It should be noted that the width of the mask layer 160 in the x-direction is larger than that of the top surface of the second spacer layer 140. Therefore, the mask layer 160 not only covers the top surface of the second spacer layer 140 but also defines the pattern of the sacrificial layer 155 to be formed.

Figure 2H:
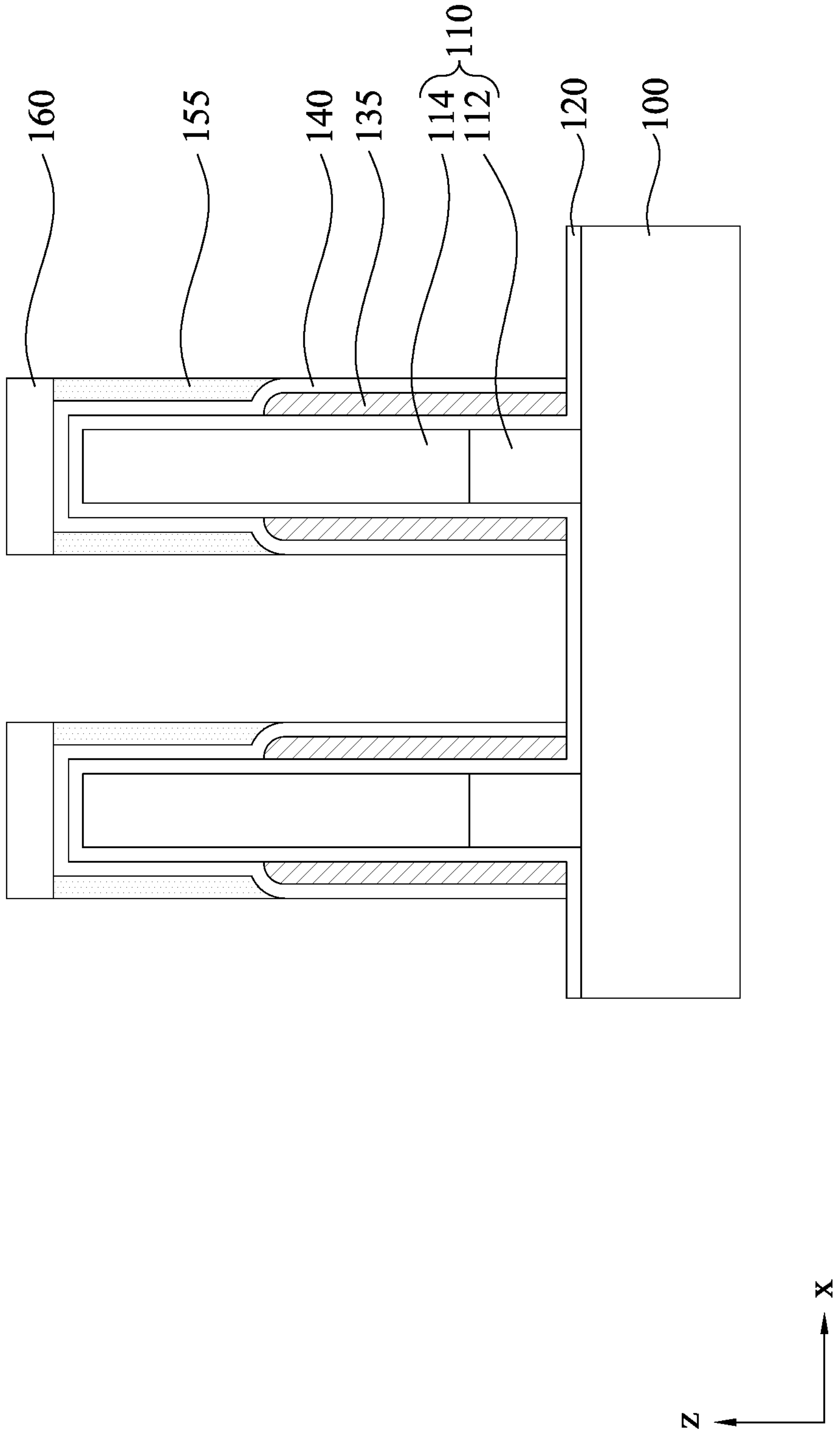

Then, as shown in FIG. 2H, the sacrificial material 150 is etched by using the mask layer 160 to form the sacrificial layer 155. The etching process stops at the second spacer layer 140 and the first spacer layer 120. In other words, the second spacer layer 140 and the first spacer layer 120 protect the low-k dielectric layer 135 from the etching of the sacrificial material 150. In some embodiments, the etching process to form the sacrificial layer 155 may be anisotropic, such as a dry etching process. The mask layer 160 may be removed after the formation of the sacrificial layer 155.

The sacrificial layer 155 after etching is positioned above the low-k dielectric layer, and the top surface of the sacrificial layer 155 is coplanar with the top surface of the second spacer layer 140. Since the thickness of the second spacer layer 140 is smaller than a width of the low-k dielectric layer 135 in the x-direction, the orthogonal projection of the sacrificial layer 155 onto the substrate 100 may be partially overlapped with that of the low-k dielectric layer 135 onto the substrate 100.

In some embodiments, the sacrificial layer 155 may cover the upper portion of the second spacer layer 140, while the outer surface of the lower portion of the second spacer layer 140 is exposed. For example, the outer surface of the sacrificial layer 155 may be coplanar with the outer surface of the second spacer layer 140, so that the outer surface portion of the second spacer layer 140 covering the low-k dielectric layer 135 is exposed. In the embodiments which the outer surface of the sacrificial layer 155 is coplanar with the outer surface of the second spacer layer 140, the width of sacrificial layer 155 in the x-direction may be equal to that of the low-k dielectric layer 135.

Figure 2I:
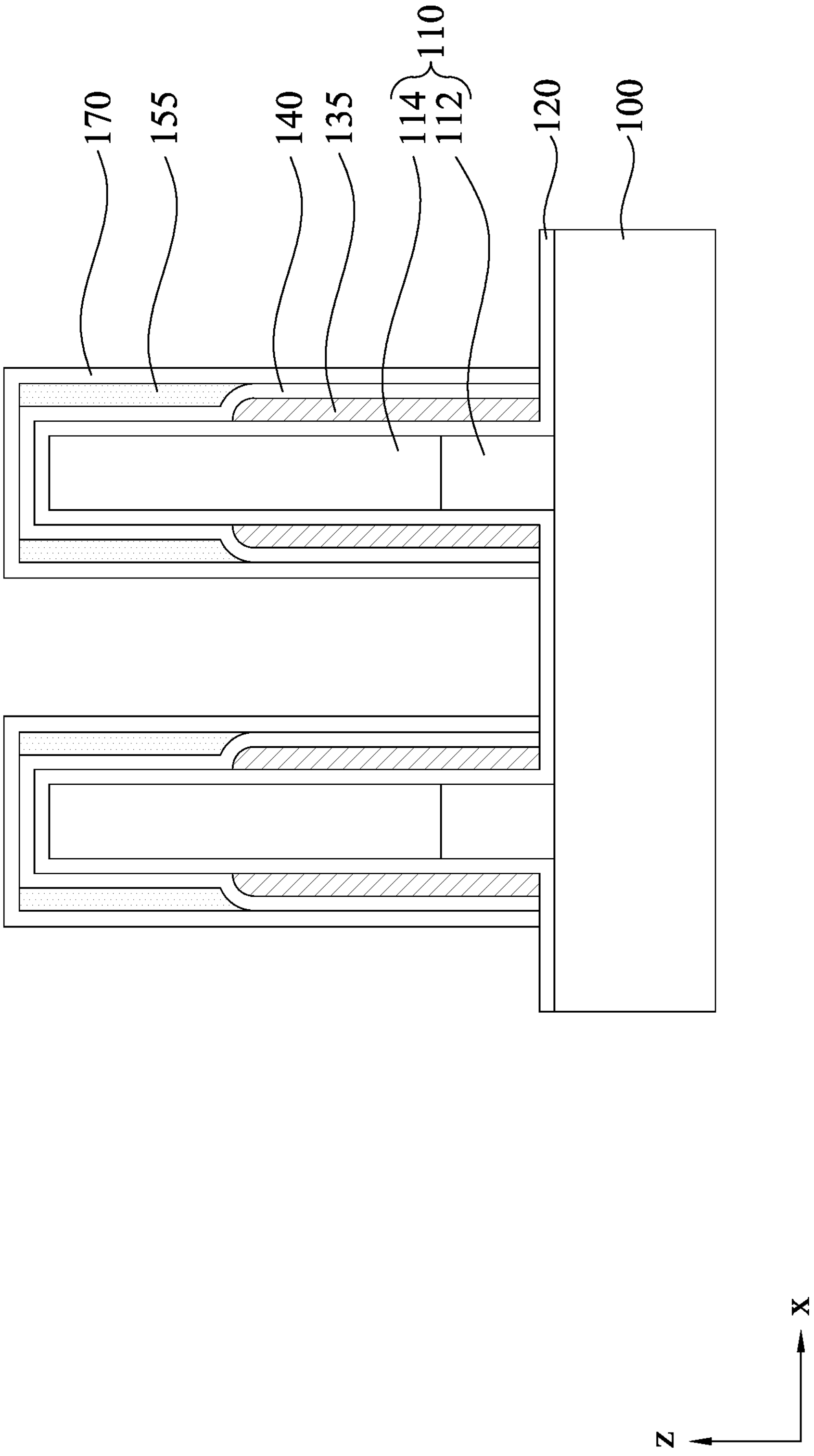

Referring to FIG. 1 and FIG. 2I, the method S10 proceeds to step S112, where a third spacer layer 170 is formed on the sacrificial layer 155 and the second spacer layer 140. Specifically, the third spacer layer 170 is conformally formed so that the third spacer layer 170 continuously covers the sacrificial layer 155 and the second spacer layer 140. Since the top surface of the sacrificial layer 155 is coplanar with the top surface of the second spacer layer 140, the third spacer layer 170 may directly contact the top surface and the sidewalls of the second spacer layer 140, thereby interposing the sacrificial layer 155 between the third spacer layer 170 and the second spacer layer 140.

The first spacer layer 120, the second spacer layer 140, and the third spacer layer 170 are referred as the multilayer spacer 175 covering the bit line 110. The low-k dielectric layer 135, the second spacer layer 140, and the sacrificial layer 155 are sandwiched between the first spacer layer 120 and the third spacer layer 170. In some embodiments, the first spacer layer 120, the second spacer layer 140, and the third spacer layer 170 may have the same thickness. In other embodiments, the thicknesses of the spacer layers of the multilayer spacer 175 may be different from each other.

In some embodiments, the third spacer layer 170 may extend from above the bit line 110 to the substrate 100 until reaching the first spacer layer 120 on the substrate 100, as shown in FIG. 2I. In some other embodiments, the third spacer layer 170 may further extend in the x-direction along the top surface of the substrate 100. In the embodiments which the outer surface of the sacrificial layer 155 is coplanar with the outer surface of the second spacer layer 140, the third spacer layer 170 may have straight sidewalls that are parallel to the sidewalls of the first spacer layer 120.

In some embodiments, the third spacer layer 170 may include the dielectric material similar to that of the second spacer layer 140, which provides high adhesion between the third spacer layer 170 and the second spacer layer 140. For example, when the second spacer layer 140 is formed of SiN, the third spacer layer 170 may also be formed of SiN. Particularly, the first spacer layer 120, the second spacer layer 140, and the third spacer layer 170 may include the same material. In some embodiments, the third spacer layer 170 may be formed by the deposition process similar to that of the first spacer layer 120, such as atomic layer deposition or the like.

Figure 2J:
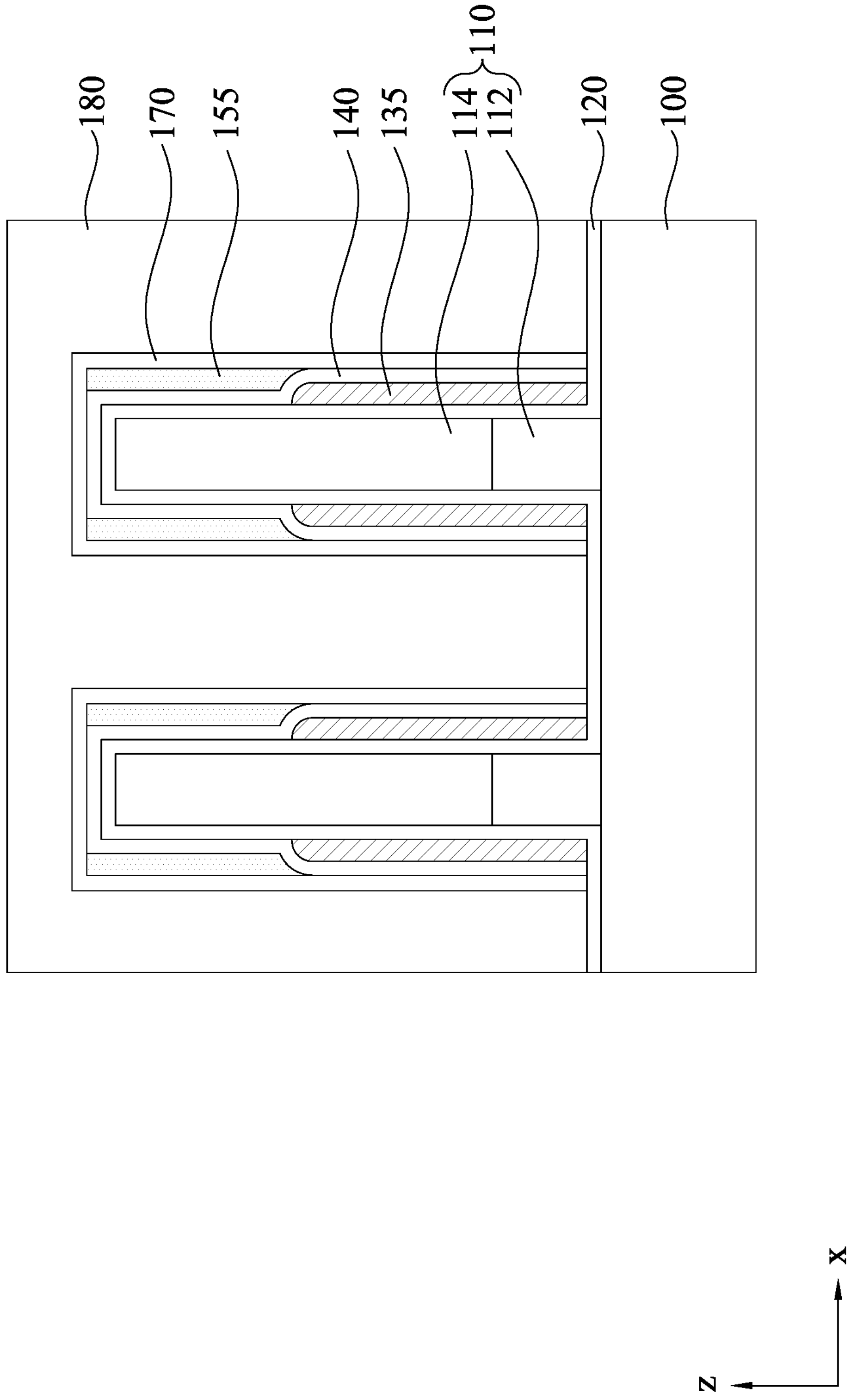
Figure 2K:
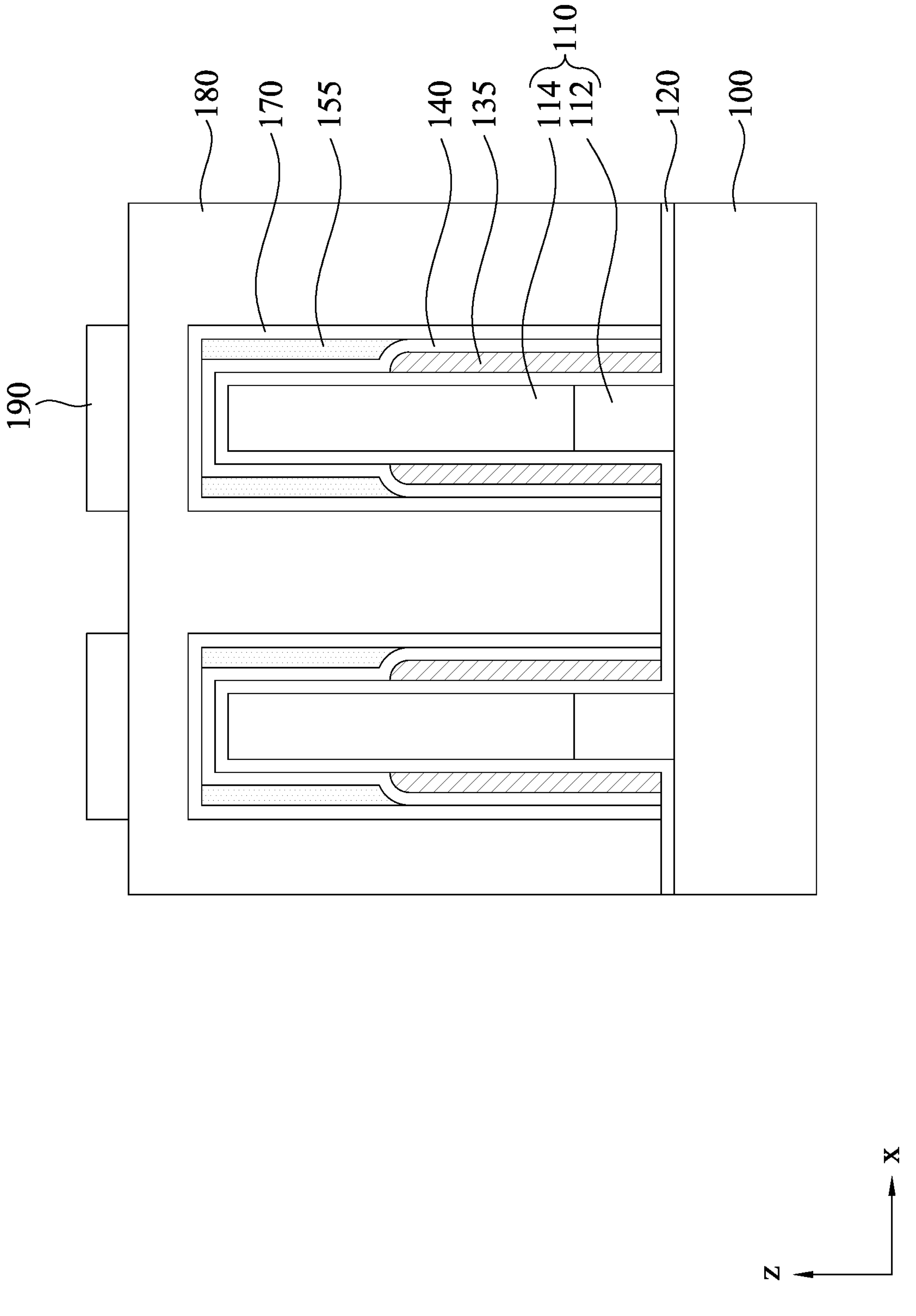
Figure 2N:
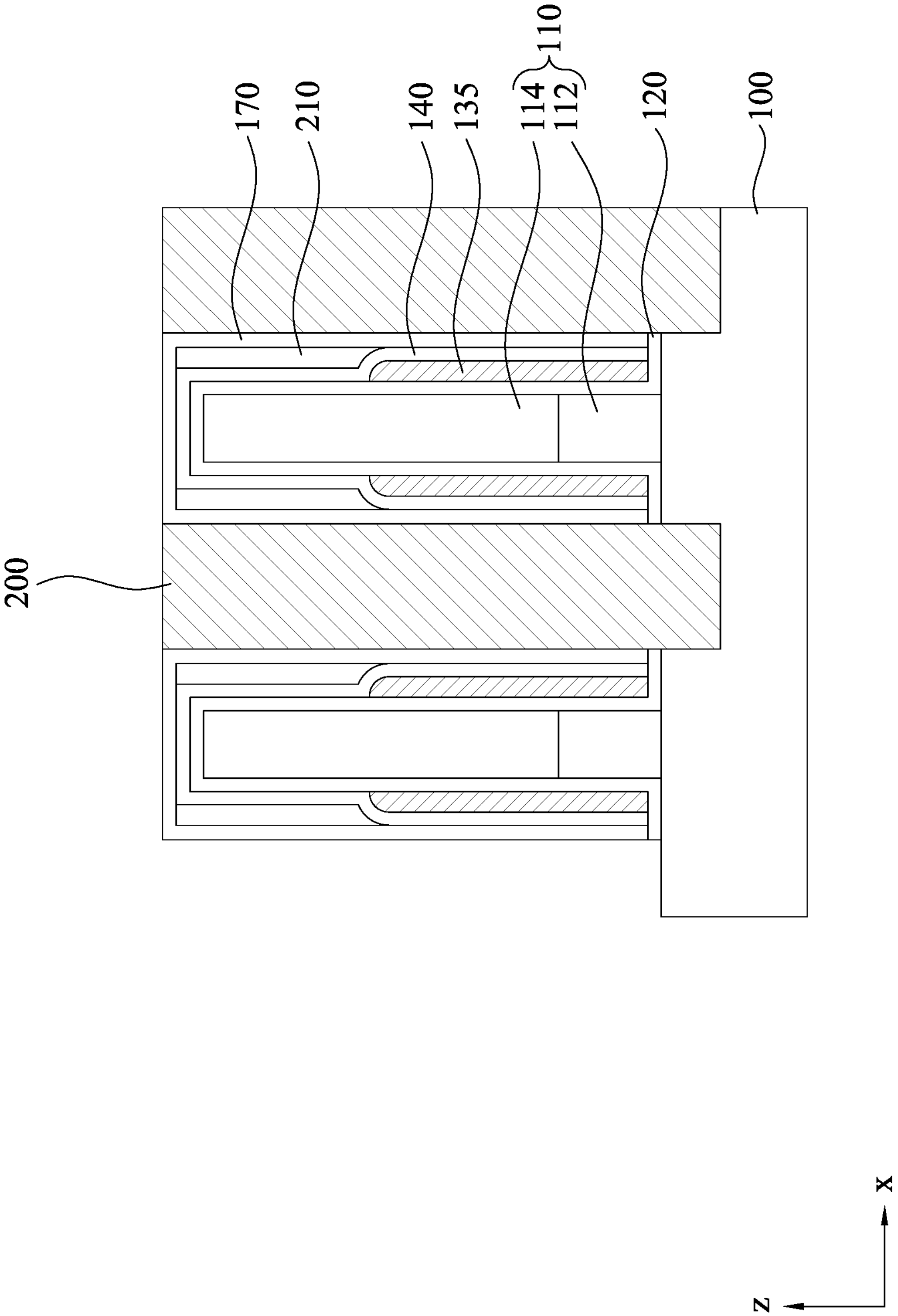
Figure 2O:
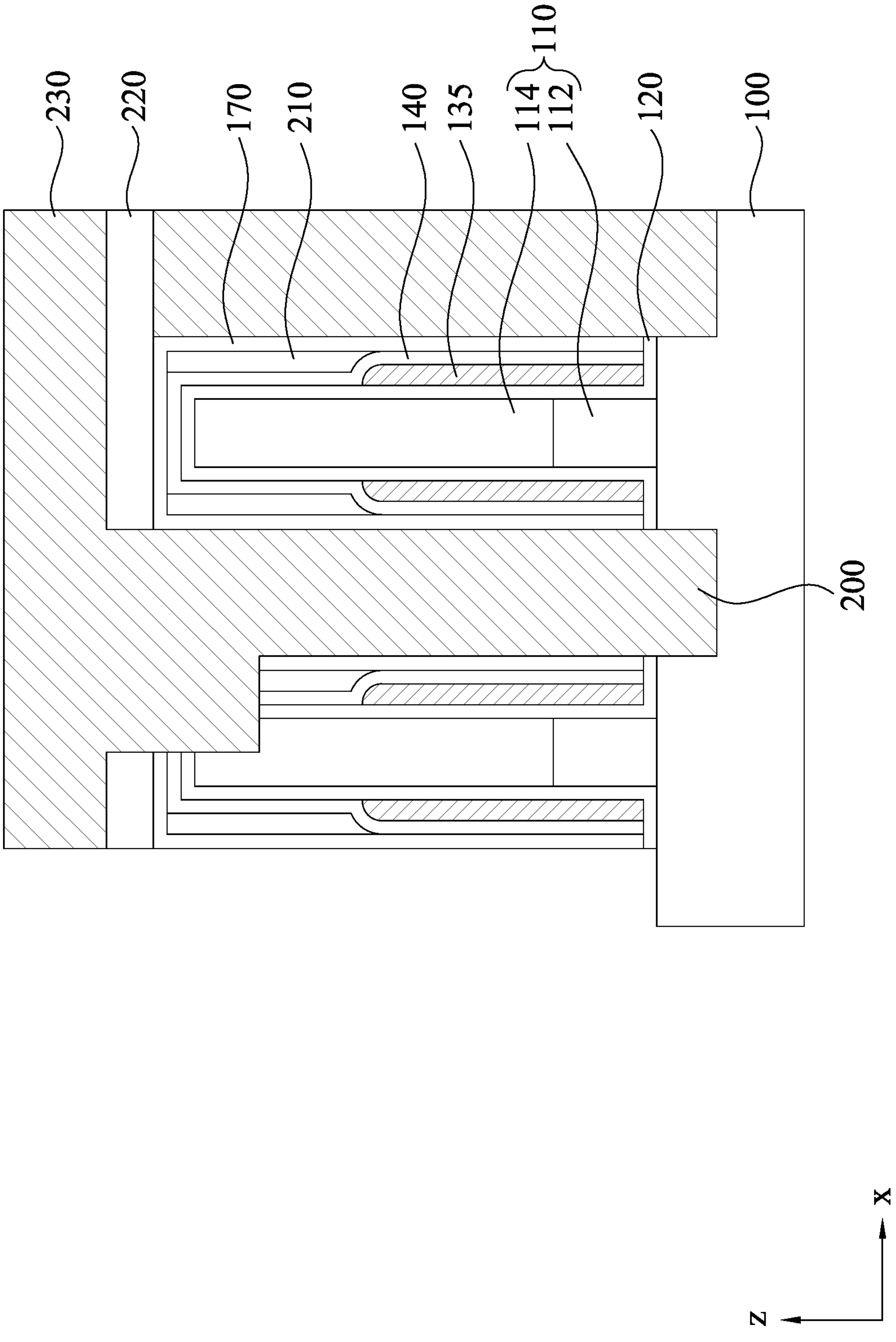

Referring to FIG. 1 and FIGS. 2J to 2M, the method S10 proceeds to step S114, where a cell contact 200 is formed adjacent to the third spacer layer 170. Specifically, a dielectric layer 180 is first formed over the third spacer layer 170, as shown in FIG. 2J. The dielectric layer 180 is filled between the adjacent bit lines 110 until the dielectric layer 180 covers the top surface and the sidewalls of the third spacer layer 170. For example, the dielectric layer 180 may include oxides suitable for chemical vapor deposition or other similar deposition process. Then, as shown in FIG. 2K, a mask layer 190 is formed on the top surface of the dielectric layer 180. The mask layer 190 may include photoresist material, so that the mask layer 190 is exposed and developed to expose portion of the dielectric layer 180. The portion of the dielectric layer 180 exposed by the mask layer 190 defines the pattern of the following formed cell contact 200.

As shown in FIG. 2L, the dielectric layer 180 is then etched by using the mask layer 190 to form the opening 180*p* in the dielectric layer 180. The opening 180*p* extends toward the substrate 100 to expose the sidewalls of the third spacer layer 170. The material layers sandwiched by the first spacer layer 120 and the third spacer layer 170 are protected from the etching of the dielectric layer 180, so the structures of the low-k dielectric layer 135 and the sacrificial layer 155 may not be affected. In some embodiments, the opening 180*p* may extend into the substrate 100, so that the bottom surface of the opening 180*p* is lower than the top surface of the substrate 100. In some embodiments, the etching process to form the opening 180*p* may be anisotropic, such as a dry etching process. The mask layer 190 may be removed after the formation of the opening 180*p*.

Then, as shown in FIG. 2M, a conductive material is filled in the opening 180*p* to form the cell contact 200. The cell contact 200 is adjacent to the third spacer layer 170, so that the third spacer layer 170 is interposed between the sacrificial layer 155 and the cell contact 200. The dielectric layer 180 may be removed after the formation of the cell contact 200. In some embodiments, the cell contact 200 may include polysilicon, doped polysilicon, metal, metal silicide, other suitable conductive material, or combinations thereof. In some embodiments, a barrier layer (not shown) may be deposited in the opening 180*p* before the formation of the cell contact 200, where the barrier layer contacts the side surface, the bottom surface, or both surfaces of the cell contact 200.

Referring to FIG. 1 and FIG. 2N, the method S10 proceeds to step S116, where the sacrificial layer 155 is removed to form an air gap 210 between the second spacer layer 140 and the third spacer layer 170. Specifically, the materials of the first spacer layer 120, the second spacer layer 140, and the third spacer layer 170 are different from that of the sacrificial layer 155, so an etching process is performed to selectively remove the sacrificial layer 155. As a result, the low-k dielectric layer 135 between the first spacer layer 120 and the second spacer layer 140 is protected from the etching of the sacrificial layer 155. Moreover, in the embodiments which the material of the low-k dielectric layer 135 is different from that of the sacrificial layer 155, the etching selectivity may be sufficiently high to selectively etch the sacrificial layer 155.

After removing the sacrificial layer 155, the air gap 210 is formed at the position of the sacrificial layer 155. In other words, the low-k dielectric layer 135 and the air gap 210 are separated by the second spacer layer 140, while the cell contact 200 and the air gap 210 are separated by the third spacer layer 170. Since the low-k dielectric layer 135 is not affected by the etching of the sacrificial layer 155, the first spacer layer 120 covered by the low-k dielectric layer 135 and the bit line 110 are protected by the low-k dielectric layer 135. As a result, the structure of the bit line 110 is maintained after forming the air gap 210, especially the side surface of the lower portion of the bit line 110.

The space of the air gap 210 is basically similar to the structure of the sacrificial layer 155. For example, the top surface of the air gap 210 may be higher than the top surface of the bit line 110 since the top surface of the sacrificial layer 155 is coplanar with the top surface of the second spacer layer 140. In the embodiments which the width of sacrificial layer 155 in the x-direction is equal to that of the low-k dielectric layer 135, the width of the air gap 210 in the x-direction may be equal to the width of the low-k dielectric layer 135.

Therefore, the memory device 10 is formed. The memory device 10 includes the bit line 110, the cell contact 200, and the multilayer spacer 175 between the bit line 110 and the cell contact 200. The low-k dielectric layer 135 and the air gap 210 are interposed in the multilayer spacer 175 to reduce the parasitic capacitance between the bit line 110 and the cell contact 200. The air gap 210 is above the low-k dielectric layer 135, so that the lower portion of the bit line 110 is protected by the low-k dielectric layer 135 during the formation of the air gap 210. The space of the air gap 210 is reserved by the low-k dielectric layer 135 and multilayer spacer 175, so that the orthogonal projection of the air gap 210 onto the substrate 100 is partially overlapped with that of the low-k dielectric layer 135 onto the substrate 100.

In some embodiments, the method S10 may proceed to step S118, where the memory device 10 may be further processed. For example, FIG. 2O illustrates the cross-sectional view of the memory device 10 after forming an interlayer dielectric 220 and a landing pad 230 above the bit line 110 and the multilayer spacer 175. The landing pad 230 is electrically connected to the bit line 110 through the interlayer dielectric 220 and the multilayer spacer 175 to form the vertical conductive path in the memory device 10. It should be noted that the memory device 10 shown in FIG. 2N and FIG. 2O are simplified to clearly illustrate the features, the memory device including additional components are also within the scope of the present disclosure.

According to the above-mentioned embodiments of the present disclosure, the memory device includes the multilayer spacer between the bit line and the cell contact. The low-k dielectric layer and the air gap above the low-k dielectric layer are interposed in the multilayer spacer. The low-k dielectric layer protects the structure of the bit line during the formation of the air gap, so the reliability of the memory device is improved. The low-k dielectric layer and the air gap show sufficiently low dielectric constant, thereby reducing the parasitic capacitance between the bit line and the cell contact.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a bit line on a substrate;
a multilayer spacer covering the bit line, comprising:
a first spacer layer covering a sidewall and a top surface of the bit line;
a second spacer layer covering a low-k dielectric layer and the first spacer layer; and
a third spacer layer covering an air gap and the second spacer layer;
the low-k dielectric layer interposed in the multilayer spacer, wherein a top surface of the low-k dielectric layer is lower than the top surface of the bit line;
the air gap interposed in the multilayer spacer, wherein the air gap is above the low-k dielectric layer, and an orthogonal projection of the air gap onto the substrate is partially overlapped with that of the low-k dielectric layer onto the substrate; and
a cell contact adjacent to the multilayer spacer, wherein the multilayer spacer, the low-k dielectric layer, and the air gap are disposed between the bit line and the cell contact.

2. The memory device of claim 1, wherein the top surface of the low-k dielectric layer is between the top surface of the bit line and a top surface of a work function layer in the bit line.

3. The memory device of claim 1, wherein a ratio of a height of the low-k dielectric layer to a height of the bit line is equal to or higher than 0.5.

4. The memory device of claim 1, wherein a dielectric constant of the low-k dielectric layer is in a range of 2.7 to 3.1.

5. The memory device of claim 1, wherein the low-k dielectric layer and the air gap are separated by the second spacer layer.

6. The memory device of claim 1, wherein a sidewall of the first spacer layer is parallel to a sidewall of the third spacer layer, and wherein the low-k dielectric layer, the second spacer layer, and the air gap are sandwiched between the sidewall of the first spacer layer and the sidewall of the third spacer layer.

7. The memory device of claim 1, wherein a thickness of the second spacer layer is smaller than a width of the low-k dielectric layer.

8. The memory device of claim 1, wherein a width of the air gap is equal to a width of the low-k dielectric layer.

9. The memory device of claim 1, wherein a top surface of the air gap is higher than the top surface of the bit line.

10. The memory device of claim 1, wherein the first spacer layer, the second spacer layer, and the third spacer layer comprises a same material.

11. The memory device of claim 1, wherein the second spacer layer directly contacts a top surface of the first spacer layer, and the third spacer layer directly contacts a top surface of the second spacer layer.

12. The memory device of claim 1, further comprising:
a landing pad above the bit line and the multilayer spacer, wherein the landing pad is electrically connected to the bit line through the multilayer spacer.

* * * * *